United States Patent
Ramey et al.

(10) Patent No.: US 11,494,541 B2
(45) Date of Patent: Nov. 8, 2022

(54) PIN SHARING FOR PHOTONIC PROCESSORS

(71) Applicant: Lightmatter, Inc., Boston, MA (US)

(72) Inventors: Carl Ramey, Westborough, MA (US); Darius Bunandar, Boston, MA (US); Nicholas C. Harris, Boston, MA (US)

(73) Assignee: Lightmatter, Inc., Boston, MA (US)

( * ) Notice: Subject to any disclaimer, the term of this patent is extended or adjusted under 35 U.S.C. 154(b) by 0 days.

(21) Appl. No.: 17/149,110

(22) Filed: Jan. 14, 2021

(65) Prior Publication Data

US 2021/0224454 A1 Jul. 22, 2021

Related U.S. Application Data

(60) Provisional application No. 62/961,975, filed on Jan. 16, 2020.

(51) Int. Cl.
| | | |
|---|---|---|
| *G06F 30/373* | (2020.01) | |
| *G06F 30/327* | (2020.01) | |
| *G06F 9/38* | (2018.01) | |
| *H04B 10/524* | (2013.01) | |
| *H01L 31/14* | (2006.01) | |
| *G02B 6/12* | (2006.01) | |
| *G02B 6/42* | (2006.01) | |
| *G02F 2/00* | (2006.01) | |

(Continued)

(52) U.S. Cl.
CPC .......... *G06F 30/373* (2020.01); *G06F 9/3877* (2013.01); *G06F 30/327* (2020.01); *H04B 10/524* (2013.01); *G02B 6/12* (2013.01); *G02B 6/12004* (2013.01); *G02B 6/12021* (2013.01); *G02B 6/42* (2013.01); *G02F 1/0344* (2013.01); *G02F 7/00* (2013.01); *H01L 31/14* (2013.01)

(58) Field of Classification Search
CPC .... G06F 30/373; G06F 30/327; G06F 9/3877; H01L 31/14; G02B 6/12; G02B 6/42; G02B 6/12004; G02B 6/12021; G02F 2/06; G02F 1/0344; G02F 7/00; H04B 10/524
USPC ........ 716/106, 136, 111; 438/17, 16, 27, 31; 398/214; 326/135
See application file for complete search history.

(56) References Cited

U.S. PATENT DOCUMENTS 4,878,726 A * 11/1989 Fatehi .................. H04B 10/032
398/20
5,131,061 A * 7/1992 Betts .................... H04B 10/801
398/139

(Continued)

OTHER PUBLICATIONS

International Search Report and Written Opinion dated Mar. 31, 2021 in connection with International Application No. PCT/US2021/013377.

*Primary Examiner* — Phallaka Kik
(74) *Attorney, Agent, or Firm* — Wolf, Greenfield & Sacks, P.C.

(57) ABSTRACT

Aspects relate to a photonic processing system, an integrated circuit, and a method of operating an integrated circuit to control components to modulate optical signals. A photonic processing system, comprising: a photonic integrated circuit comprising: a first electrically-controllable photonic component electrically coupling an input pin to a first output pin; and a second electrically-controllable photonic component electrically coupling the input pin to a second output pin.

27 Claims, 12 Drawing Sheets

(51) Int. Cl.
*G02F 1/03* (2006.01)
*G02F 7/00* (2006.01)

(56) References Cited

U.S. PATENT DOCUMENTS

| | | | | |
|---|---|---|---|---|
| 5,185,833 | A * | 2/1993 | Betts | H04B 10/801 398/102 |
| 6,477,286 | B1 * | 11/2002 | Ouchi | G02B 6/10 257/433 |
| 7,356,213 | B1 * | 4/2008 | Cunningham | H01L 23/48 385/14 |
| 7,657,809 | B1 * | 2/2010 | Bhatia | G01R 31/318563 714/731 |
| 7,676,153 | B1 * | 3/2010 | Seetharaman | G02B 26/0841 398/45 |
| 9,077,447 | B1 * | 7/2015 | Mohageg | G02B 6/29389 |
| 9,871,366 | B1 * | 1/2018 | Li | H02H 3/044 |
| 9,939,708 | B2 * | 4/2018 | Aimone | G02F 1/2257 |
| 11,280,959 | B2 * | 3/2022 | Meade | G01M 11/31 |
| 11,281,972 | B2 * | 3/2022 | Shen | G06N 3/0445 |
| 2003/0095737 | A1 | 5/2003 | Welch et al. | |
| 2004/0085292 | A1 | 5/2004 | Spitzer et al. | |
| 2004/0126053 | A1 * | 7/2004 | Ouchi | G02B 6/12004 385/14 |
| 2004/0139377 | A1 * | 7/2004 | Barnhart | G01R 31/31926 714/726 |
| 2004/0148554 | A1 * | 7/2004 | Dervisoglu | G01R 31/318552 714/727 |
| 2005/0028060 | A1 * | 2/2005 | Dervisoglu | G01R 31/318335 714/726 |
| 2005/0213883 | A1 * | 9/2005 | Welch | H04B 10/50 385/37 |
| 2006/0171011 | A1 * | 8/2006 | Nakajima | G02F 1/0356 359/239 |
| 2007/0011542 | A1 * | 1/2007 | Mukherjee | G01R 31/318541 714/738 |
| 2008/0023700 | A1 * | 1/2008 | Gschwind | G01R 31/318569 257/48 |
| 2008/0195346 | A1 * | 8/2008 | Lin | G01R 31/318575 702/120 |
| 2008/0256497 | A1 * | 10/2008 | Wohl | G06F 30/327 326/38 |
| 2009/0125770 | A1 * | 5/2009 | Parulkar | G01R 31/318533 714/E11.155 |
| 2009/0202196 | A1 | 8/2009 | Kish, Jr. et al. | |
| 2009/0256817 | A1 | 10/2009 | Perlin et al. | |
| 2010/0254535 | A1 * | 10/2010 | Selinfreund | G06F 21/64 380/256 |
| 2011/0307750 | A1 * | 12/2011 | Narayanan | G01R 31/318547 714/E11.055 |
| 2012/0072879 | A1 * | 3/2012 | Gizdarski | G01R 31/318335 716/112 |
| 2012/0209556 | A1 * | 8/2012 | Rajski | G01R 31/318575 702/108 |
| 2012/0226953 | A1 * | 9/2012 | Nakazato | G06F 11/27 714/E11.155 |
| 2015/0028674 | A1 * | 1/2015 | Sampayan | H02M 7/12 307/43 |
| 2016/0085038 | A1 | 3/2016 | Decker et al. | |
| 2016/0218810 | A1 * | 7/2016 | Nagashima | H05K 1/0228 |
| 2016/0245719 | A1 * | 8/2016 | Zou | G01M 11/3145 |
| 2017/0139240 | A1 * | 5/2017 | Katou | G02F 1/035 |
| 2017/0219851 | A1 * | 8/2017 | Miyazaki | G02F 1/0356 |
| 2017/0308325 | A1 * | 10/2017 | Pearson | G06F 3/0619 |
| 2018/0188632 | A1 * | 7/2018 | Celo | G02F 1/0147 |
| 2018/0227549 | A1 * | 8/2018 | Cai | H01L 27/1464 |
| 2018/0267384 | A1 * | 9/2018 | Padmaraju | G02F 1/225 |
| 2019/0011500 | A1 * | 1/2019 | Shah | G01R 31/3177 |
| 2019/0267973 | A1 * | 8/2019 | Nakako | G01R 31/318541 |
| 2020/0049737 | A1 * | 2/2020 | Wang | G01R 1/0735 |
| 2020/0256958 | A1 * | 8/2020 | Piggott | G01S 17/894 |
| 2022/0123839 | A1 * | 4/2022 | Campos | H04B 10/502 |

* cited by examiner

PIN SHARING FOR PHOTONIC PROCESSORS

CROSS-REFERENCE TO RELATED APPLICATIONS

This application claims the benefit under 35 U.S.C. § 119(e) to U.S. Provisional Patent Application Ser. No. 62/961,975, titled "PIN SHARING FOR PHOTONICS PROCESSORS," filed on Jan. 16, 2020, under which is hereby incorporated by reference herein in its entirety.

BACKGROUND

Conventional computation uses processors that include circuits and millions of transistors to implement logical gates on bits of information represented by electrical signals. The architectures of conventional central processing units (CPUs) are designed for general purpose computing but are not optimized for particular types of algorithms. Graphics processing, artificial intelligence, neural networks, and deep learning are a few examples of the types of algorithms that are computationally intensive and are not efficiently performed using a CPU. Consequently, specialized processors have been developed with architectures better-suited for particular algorithms. Graphical processing units (GPUs), for example, have a highly parallel architecture that makes them more efficient than CPUs for performing image processing and graphical manipulations. After their development for graphics processing, GPUs were also found to be more efficient than CPUs for other memory-intensive algorithms, such as neural networks and deep learning. This realization, and the increasing popularity of artificial intelligence and deep learning, lead to further research into new electrical circuit architectures that could further enhance the speed of these algorithms.

SUMMARY

Some embodiments are directed to a photonic processing system, comprising: a photonic integrated circuit comprising: a first electrically-controllable photonic component electrically coupling an input pin to a first output pin; and a second electrically-controllable photonic component electrically coupling the input pin to a second output pin.

In some embodiments, the photonic processing system further comprises an electronic integrated circuit comprising: a driver electrically coupled to the input pin; a first switch electrically coupled to the first output pin; and a second switch electrically coupled to the second output pin.

In some embodiments, the driver comprises a digital-to-analog converter (DAC).

In some embodiments, the first switch and the second switch are electrically coupled to a common reference voltage terminal.

In some embodiments, the reference voltage terminal is further coupled to the driver.

In some embodiments, the electronic integrated circuit and the photonic integrated circuit are vertically stacked.

In some embodiments, the electronic integrated circuit and the photonic integrated circuit are disposed on a common substrate.

In some embodiments, the electronic integrated circuit and the photonic integrated circuit are disposed on an interposer.

In some embodiments, the input pin is a first input pin and the photonic integrated circuit further comprises a plurality of input pins and a plurality of output pins, wherein the plurality of output pins comprises the first output pin and the second output pin and the plurality of input pins comprises the first input pin.

In some embodiments, the photonic integrated circuit further comprises a third electrically controllable photonic component electrically coupling a second input pin of the plurality of input pins to the first output pin.

In some embodiments, the photonic integrated circuit further comprises a fourth electrically-controllable photonic component electrically coupling the second input pin to the second output pin.

In some embodiments, the plurality of input pins comprises between 8 and 1024 input pins, and wherein the plurality of output pins comprises between 8 and 1024 output pins.

In some embodiments, the photonic integrated circuit comprises between 64 and 140,000 photonic components.

In some embodiments, the first electrically-controllable photonic component comprises an optical modulator.

In some embodiments, the optical modulator comprises a Mach-Zehnder interferometer.

In some embodiments, the optical modulator comprises a ring modulator.

Some embodiments are directed to a photonic processing system, comprising: a photonic integrated circuit comprising: a first input pin and a first output pin; and a first electrically-controllable photonic component electrically coupling the first input pin to the first output pin; and an electronic integrated circuit comprising: a first driver electrically coupled to the first input pin; and a first switch electrically coupled to the first output pin.

In some embodiments, the photonic integrated circuit further comprises a second output pin and a second electrically-controllable photonic component electrically coupling the first input pin to the second output pin, and wherein the electronic integrated circuit further comprises a second switch electrically coupled to the second output pin.

In some embodiments, the photonic integrated circuit further comprises a second input pin and a third electrically-controllable photonic component electrically coupling the second input pin to the first output pin, and wherein the electronic integrated circuit further comprises a second driver electrically coupled to the second input pin.

In some embodiments, the photonic integrated circuit further comprises a fourth electrically-controllable photonic component electrically coupling the second input pin to the second output pin.

In some embodiments, the first driver comprises a digital-to-analog converter (DAC).

In some embodiments, the photonic integrated circuit comprises a silicon photonics integrated circuit.

In some embodiments, the photonic integrated circuit comprises between 8 and 1024 input pins, and between 8 and 1024 output pins.

In some embodiments, the photonic integrated circuit comprises between 64 and 140,000 photonic components.

In some embodiments, the first electrically-controllable photonic component comprises an optical modulator.

In some embodiments, the electronic integrated circuit and the photonic integrated circuit are vertically stacked.

In some embodiments, the electronic integrated circuit and the photonic integrated circuit are disposed on a common substrate.

In some embodiments the electronic integrated circuit and the photonic integrated circuit are disposed on an interposer.

Some embodiments are directed to a method of manufacturing a photonic chip, comprising: forming an integrated circuit comprising: forming a first electrically-controllable photonic component electrically coupling a first input pin to a first output pin; and forming a second electrically-controllable photonic component electrically coupling the input pin to a second output pin.

In some embodiments, the method further comprises forming a third electrically-controllable photonic component electrically coupling a second input pin to the first output pin.

In some embodiments, the method further comprises forming a fourth electrically-controllable photonic component electrically coupling the second input pin to the second output pin.

In some embodiments, the method further comprises forming between 8 and 1024 input pins and forming between 8 and 1024 output pins.

Some embodiments are directed to a method of operating a photonic processing system comprising a photonic integrated circuit and an electronic integrated circuit, the method comprising: modulating a first optical signal using a first electrically-controllable photonic component disposed on the photonic integrated circuit, the first electrically-controllable photonic component being coupled to both a first input pin of the photonic integrated circuit and a first output pin of the photonic integrated circuit, wherein the modulating comprises: forming a first electrically conductive path between the first output pin of the photonic integrated circuit and a reference voltage terminal by closing a first switch disposed on the electronic integrated circuit; and producing a first analog signal using a first driver disposed on the electronic integrated circuit and coupling the first analog signal to the first input pin of the photonic integrated circuit.

In some embodiments, the method further comprises: modulating a second optical signal using a second electrically-controllable photonic component disposed on the photonic integrated circuit, the second electrically-controllable photonic component being coupled to both the first input pin of the photonic integrated circuit and a second output pin of the photonic integrated circuit, wherein the modulating comprises: subsequent to closing the first switch and further subsequent to re-opening the first switch, forming a second electrically conductive path between the second output pin of the photonic integrated circuit and the reference voltage terminal by closing a second switch disposed on the electronic integrated circuit; and producing a second analog signal using the first driver and coupling the second analog signal to the first input pin of the photonic integrated circuit.

In some embodiments, the method further comprises: modulating a third optical signal using a third electrically-controllable photonic component disposed on the photonic integrated circuit, the third electrically-controllable photonic component being coupled to both a second input pin of the photonic integrated circuit and the first output pin of the photonic integrated circuit, wherein the modulating comprises: subsequent to closing the first switch and further subsequent to re-opening the first switch, re-forming the first electrically conductive path between the first output pin of the photonic integrated circuit and the reference voltage terminal by closing the first switch; and producing a third analog signal using a second driver disposed on the electronic integrated circuit and coupling the third analog signal to the second input pin of the photonic integrated circuit.

Some embodiments are directed to an electronic device, comprising: an integrated circuit comprising: a plurality of electrical input pins disposed at an electrical input/output interface of the integrated circuit; a plurality of electrical output pins disposed at the electrical input/output interface of the integrated circuit; a first row line coupled to a first output pin of the plurality of output pins and a second row line coupled to a second output pin of the plurality of output pins; a first column line coupled to a first input pin of the plurality of input pins and a second column line coupled to a second input pin of the plurality of input pins; a first impedance component electrically coupling the first row line to the first column line; a second impedance component electrically coupling the first row line to the second column line; a third impedance component electrically coupling the second row line to the first column line; a fourth impedance component electrically coupling the second row line to the second column line.

In some embodiments, the first impedance component comprises a capacitor electrically coupling the first row line to the first column line.

In some embodiments, the first impedance component comprises an inductor electrically coupling the first row line to the first column line.

In some embodiments, the first impedance component comprises a resistor electrically coupling the first row line to the first column line.

In some embodiments, the electrical input/output interface is disposed on a top surface and/or a bottom surface of the integrated circuit.

In some embodiments, the electrical input/output interface is disposed on a perimeter of the integrated circuit.

Some embodiments are directed to a method of manufacturing a photonic processing system, comprising: obtaining a photonic integrated circuit comprising: a first electrically-controllable photonic component electrically coupling an input pin to a first output pin; and a second electrically-controllable photonic component electrically coupling the input pin to a second output pin; obtaining an electronic integrated circuit comprising: a driver; a first switch; and a second switch; and packaging the photonic integrated circuit with the electronic integrated circuit, the packaging comprising: forming an electrical connection between the driver and the input pin; forming an electrical connection between the first switch and the first output pin; and forming an electrical connection between the second switch and the second output pin.

In some embodiments, the photonic integrated circuit comprises between 8 and 1024 input pins, and between 8 and 1024 output pins.

In some embodiments, the packaging comprises vertically stacking the photonic integrated circuit and the electronic integrated circuit.

In some embodiments, the packaging comprises disposing the photonic integrated circuit and the electronic integrated circuit on a common substrate.

Some embodiments are directed to a photonic processing chip, comprising: at least X*Y electrically-controllable photonic components arranged in X row lines and Y column lines; and between X+Y and 2(X+Y) pins.

In some embodiments, X is greater than or equal to Y.

In some embodiments, X is less than Y.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

I. Overview

Figure 1:
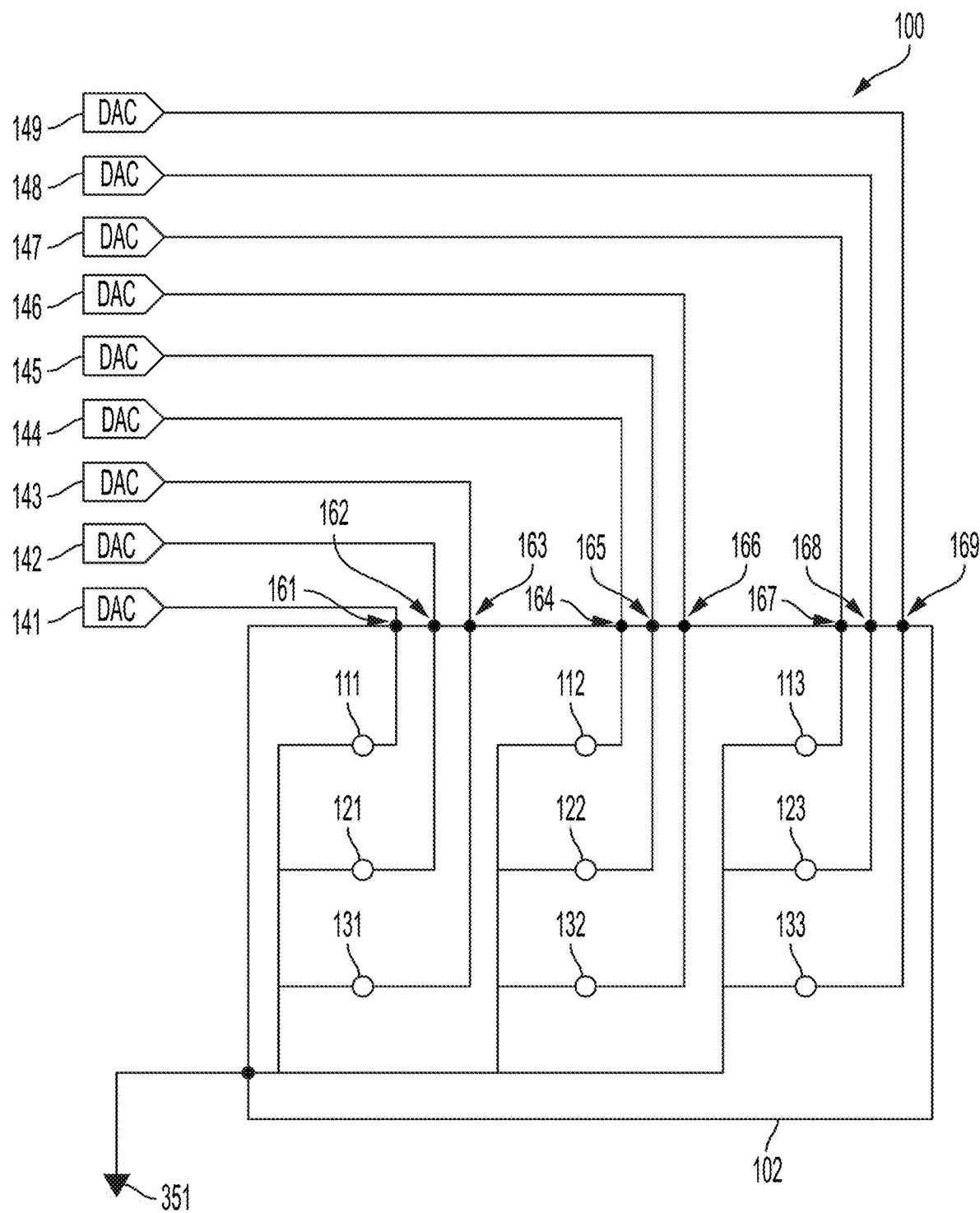
FIG. 1 is a schematic diagram of an integrated circuit for controlling a photonic device.

Photonic processors represent a promising solution to overcome the poor bandwidth and high-power consumption that characterize conventional digital central processing units (CPUs). As such, photonic processors are expected to replace conventional CPUs in a variety of computationally intensive applications, such as in deep learning. Despite an ever-increasing trajectory in the development of photonic processors, the inventors have recognized and appreciated a significant bottleneck that limits the usability of photonic processors: the maximum number of pins that interface a photonic processor with other electronic systems is far less than the number of photonic components that constitute the photonic processor. This is because the space available to accommodate pins (typically on or near the perimeter of the chip, or near the top and/or bottom surface of the chip) is significantly smaller than the space available for the photonic components. Oftentimes, the size of the pin (hundreds of microns) can be orders of magnitude larger than the size of each photonic device (smaller than 10 microns). The inventors have developed photonic processors that overcome the pin count bottleneck.

Photonic processors are analog circuits that perform complex operations using or on optical signals. Some photonic processors, for example, use optical signals to perform mathematical operations, such as matrix-matrix multiplications. To process optical signals to produce the desired output, photonic processors use electrically-controllable photonic components. Examples of such photonic components include optical intensity modulators, optical phase modulators, and optical switches, among others. Electronic controllers are used to control the operations of these photonic components. Consider for example a photonic processor configured to multiply an input vector by a weight matrix. An electronic controller is used to program multiple photonic components to represent, in the optical domain, scalar weights. Thus, photonic processors are often provided in combination with electronic controllers.

The inventors have appreciated that providing a system in which a photonic processor communicates with an electronic controller presents a challenge. Most semiconductor foundries do not allow for co-fabrication of transistors and photonic components on a single chip. Transistors are fabricated using fabrication nodes that are substantially smaller than the fabrication nodes typically required for photonic components. Processes that use smaller fabrication nodes, of course, are significantly more costly than processes that use larger fabrication nodes because the former require more sophisticated photolithography tools. Therefore, it is not economical to dedicate expensive real estate on a chip fabricated using small fabrication nodes to photonic components, the operation of which is agnostic to the fabrication node. This means that these semiconductor foundries do not permit co-fabrication on the same chip of photonic processors with the transistors that constitute the electronic controller. Therefore, designers of photonic computing systems are relegated to place a photonic processor on a first chip and an electronic controller on a separate chip, and to allow for communication between the chips using external interconnects (e.g., bond wires, ball grid arrays, copper pillars, through-silicon vias, etc.). Pins are used to interface the external interconnects to the photonic components inside the photonic processor chip. Unfortunately, the number of pins that can be accommodated for a single die is limited by the footprint of the die and the pin size. Many modern processors have between 1000 and 5000 pins. However, as the number of pins increases beyond 20,000, the packaging yield decreases significantly and, as a result, manufacturing costs become prohibitive. At the same time, modern computing tasks require many mathematical operations to be computed at the same time, thus benefiting from having more computing components available for executing mathematical operations on a photonic processor. For example, a photonic processor may require as many as 65,536 photonic components to handle matrix-matrix multiplications over matrices with 256×256 elements. Each photonic component requires a control signal, meaning that the photonic processors may require as many as 65,536 pins to individually control each photonic component. It may not be economical, under commercial manufacturing techniques, to accommodate the number of pins required to individually control the 65,536 photonic components onto a single chip without vastly increasing the size of the chip or by distributing the 65,536 photonic components over several chips. As such, the number of photonic components may be limited to the number of pins that can be accommodated by the chip, thus creating a significant bottleneck.

Recognizing the pin count bottleneck described above, the inventors have developed architectures that allow for arbitrarily large numbers of photonic components to be individually controlled without requiring an equal number of pins. For a photonic processor with 65,536 photonic components, individual control of the photonic components can be realized using only 512 pins, in accordance with technologies described herein. For example, 256 input pins and 256 output pins may be used to control the 65,536 photonic components by using shared input and shared output pins on the photonic chip in combination with drivers coupled to the shared input pins and switches coupling the shared output pins. The drivers and switches, being made of transistors, are located on the electronic chip. In some embodiments, the 65,536 photonic components are arranged on the photonic chip in 256 columns electrically coupled to input pins and 256 rows electrically coupled to respective output pins, such that each component is electrically coupled to a single shared input pin and a single shared output pin. The drivers transmit control signals for a first photonic component to a first shared input pin. The switches may close to couple a respective shared output pin to a reference voltage terminal, thereby providing a continuous electric path from the driver to the reference voltage terminal that passes through a photonic component. To prevent all of the photonic components from receiving every signal received by the first input pin, in some embodiments, only the switches corresponding to photonic components intended to receive respective signals are closed when the signal is received, and the remaining switches are left open. By time cycling through the switches, each component may individually receive signals, at different times, from the same shared input pin.

Accordingly, some embodiments are directed to a photonic processing system, comprising: a photonic integrated circuit comprising: a first electrically-controllable photonic component electrically coupling an input pin to a first output pin; and a second electrically-controllable photonic component electrically coupling the input pin to a second output pin. Further, some embodiments are directed to a photonic processing system, comprising: a photonic integrated circuit comprising: a first input pin and a first output pin; and a first electrically-controllable photonic component electrically coupling the first input pin to the first output pin; and an electronic integrated circuit comprising: a first driver electrically coupled to the first input pin; and a first switch electrically coupled to the first output pin.

It should be noted that the pin sharing techniques described herein may be used in connection with integrated circuits other than photonic processors. In some embodiments, for example, impedance elements (e.g., resistors, capacitors and/or inductors) may be used in lieu of photonic components.

II. Circuits and Methods for Controlling Photonics Processors

As described above, some semiconductor foundries generally do not permit co-integration of transistors and photonic components. As such, photonic chips require a dedicated pin for each electrically-controllable photonic component that is to be independently controlled. As illustrated in FIG. 1, nine input pins and nine digital-to-analog converters (DACs) must be included in a system to control nine electrically-controllable photonic components.

FIG. 1 illustrates an integrated circuit for controlling a photonic processor. Photonic processing system 100 includes photonic integrated circuit 102, digital-to-analog converters (DACs) 141, 142, 143, 144, 145, 146, 147, 148 and 149, and reference voltage terminal 151. Photonic integrated circuit 102 includes a plurality of n electrically-controllable photonic components. For the sake of simplicity, only n=9 electrically-controllable photonic components (111, 112, 113, 121, 122, 123, 131, 132, 133) are shown in the integrated circuit of FIG. 1. Examples of electrically-controllable photonic components include optical phase modulators, optical intensity modulators, optical switches, and optical couplers characterized by controllable coupling ratios, among others. An electrically-controllable component is designed so that, when a control signal is applied to it, an optical characteristic varies, thereby producing a change in an optical signal that passes through it. As one example, a photonic component may include a pn-junction phase modulator. When a voltage is applied between the p-terminal and the n-terminal, carriers are either injected to or extracted from the depletion region, which produce a local change in the material's refractive index. Under these conditions, an optical signal that passes through the photonic component undergoes a phase shift. As another example, a photonic component may include a resistive phase modulator. When a voltage is applied across the resistive modulator, a current flows through it which produces a spot of localized temperature increase. The temperature increase, in turn, produces a local change in the material's refractive index. Again, an optical signal that passes through the photonic component undergoes a phase shift.

Pins of the types described herein are positioned at the interface between a photonic integrated circuit and the devices outside the photonic integrated circuit. As a result, the pins are accessible from any electronic apparatus located outside the photonic integrated circuit. For example, pins may be disposed at the perimeter of the chip or at the top and/or bottom surface of the chip. When the pin is not connected to any electronic apparatus outside the chip, the pin is an electrically floating terminal. Examples of pins include conductive connectors, conductive pads (which may be exposed to air so that a bond wire or other connector may be attached to it), a socket, an adapter, a via (e.g., through silicon via or through oxide via) a conductive bump, a conductive ball, a conductive pillar, a solder, etc.

In photonic processing system 100, each electrically-controllable photonic component is electrically coupled to a respective input pin, from which the electrically-controllable photonic component receives an electrical input signal (e.g., a modulation signal). In other words, there is a dedicated input pin for each photonic component. For example, component 111 is electrically coupled to input pin 161, component 121 is electrically coupled to input pin 162, and component 131 is electrically coupled to input pin 163. Similarly, components 112, 122, 132, 113, 123, and 133 are electrically coupled to respective input pins 164, 165, 166, 167, 168, and 169. In total, to control the nine electrically-controllable photonic components, integrated circuit 102 requires nine input pins.

The electrically-controllable photonic components receive signals from respective DACs through the input pins. For example, DAC 141 is electrically coupled to input pin 161 so that it can transmit a control signal (e.g., a control voltage or a control current) to component 111, for example to modulate an optical input signal passing through component 111. Similarly, DAC 142 is electrically coupled to input pin 162 and DAC 143 is electrically coupled to input pin 163. DACs 144, 145, 146, 147, 148, and 149 are coupled to respective input pins 164, 165, 166, 167, 168, and 169.

The arrangement of FIG. 1 involves a dedicated pin and a dedicated electronic control circuit (a DAC in this case) for each photonic component. If a photonic integrated circuit arranged in this manner is used in a photonic processing system, the number of electrically-controllable photonic components that may be individually controlled by the system may be severely limited by the number of input pins which can be accommodated by the photonic processor.

Figure 2:
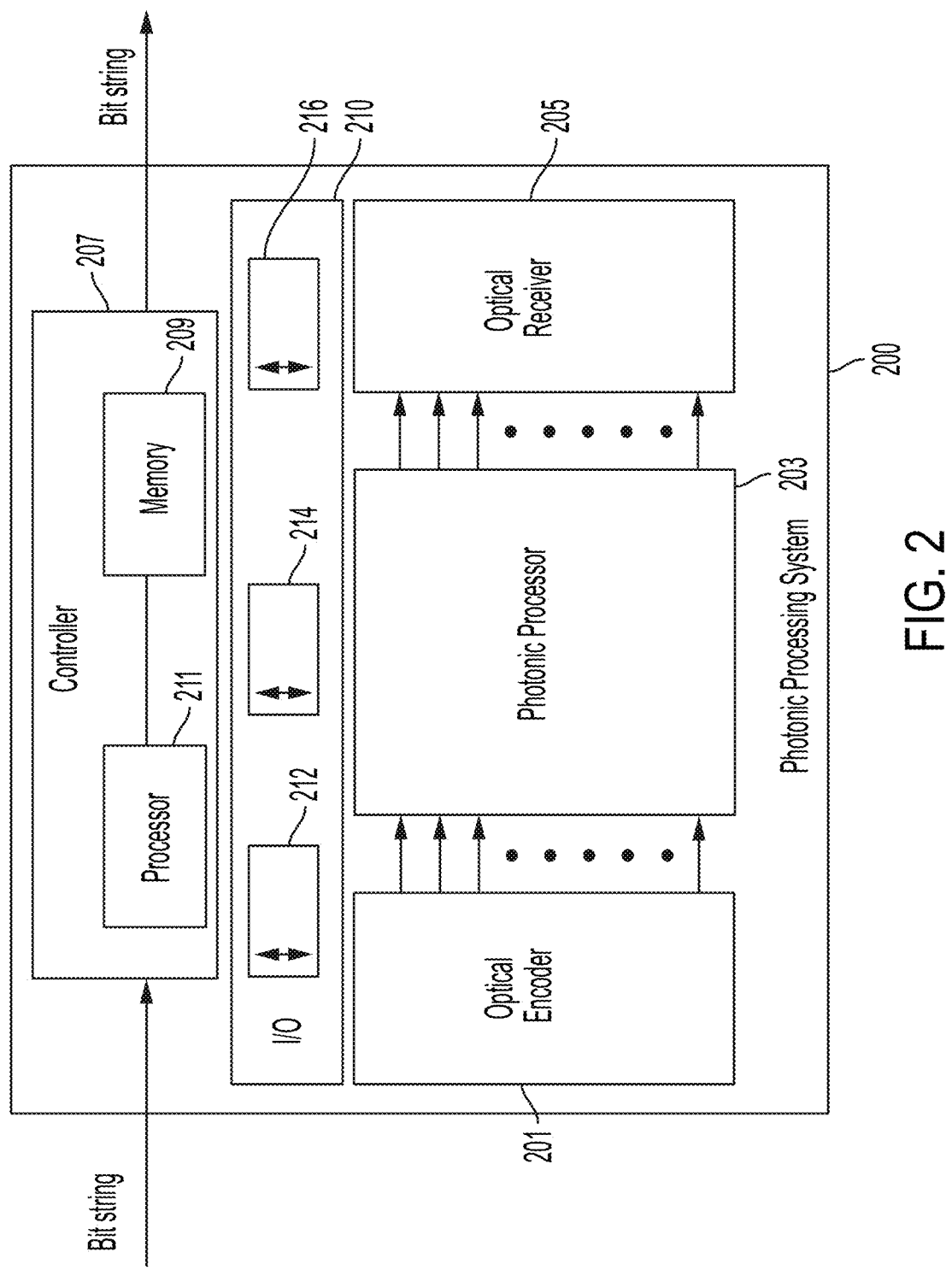
FIG. 2 is a schematic diagram of a photonic processing system, in accordance with some non-limiting embodiments.

FIG. 2 illustrates exemplary components of a photonic processing system, in accordance with some embodiments described herein. In the illustrative example of FIG. 2, photonic processing system 200 includes optical encoder 201, photonic processor 203, optical receiver 205, I/O interface 210, and controller 207. In some embodiments, photonic processing system 200 is configured to perform matrix-matrix multiplications in the optical domain. It should be appreciated that system 200 is illustrative and that a photonic processing system may have one or more additional components in addition to or instead of the components illustrated in FIG. 2.

In the illustrated embodiment, the controller 207 includes a memory 209 and a processor 211 for controlling the optical encoder 201, photonic processor 203, and optical receiver 205 through I/O interface 210. The memory 209 may be used to store input and output bit strings and measurement results from the optical receiver 205. The memory also stores executable instructions that, when executed by the processor 211, control the photonic processing system to perform mathematical operations. For example, controller 207 may control the optical encoder 201, may control the electronically-controllable photonic components of the photonic processor 203, and may control the optical receivers 205.

I/O interface 210 may include electrical channel sets 212, 214, and 216. Each channel set includes a plurality of electrical channels. Channel set 212 enables communication between controller 207 and the optical encoder 201, channel set 214 enables communication between controller 207 and photonic processor 203, and channel set 216 enables communication between controller 207 and optical receiver 205. Each channel of a set carries an electrical signal. For example, each channel of set 214 carries a signal generated by a DAC for controlling the operation of a corresponding electrically-controllable photonic component of photonic processor 203. Using the architecture of FIG. 1, there are as many channels as part of set 214 as there are photonic components in the photonic processor. Additionally, photonic processor 203 has as many pins as photonic components. However, some photonic processors may include hundreds of thousands of photonic components, and controlling these components using the architecture of FIG. 1 may not be practical.

As described above, the inventors have recognized and appreciated that having multiple electrically-controllable photonic components coupled to a common input pin, and using switches to select specific electrically-controllable photonic components to receive electronic signals from the common input pin, may reduce the overall number of pins required to control a given number of electrically-controllable photonic components. As a result, a greater number of electrically-controllable photonic components may be included with a photonic integrated circuit without also having to increase the number of pins, thereby increasing the number of mathematical operations that can be performed in parallel.

Figure 3A:
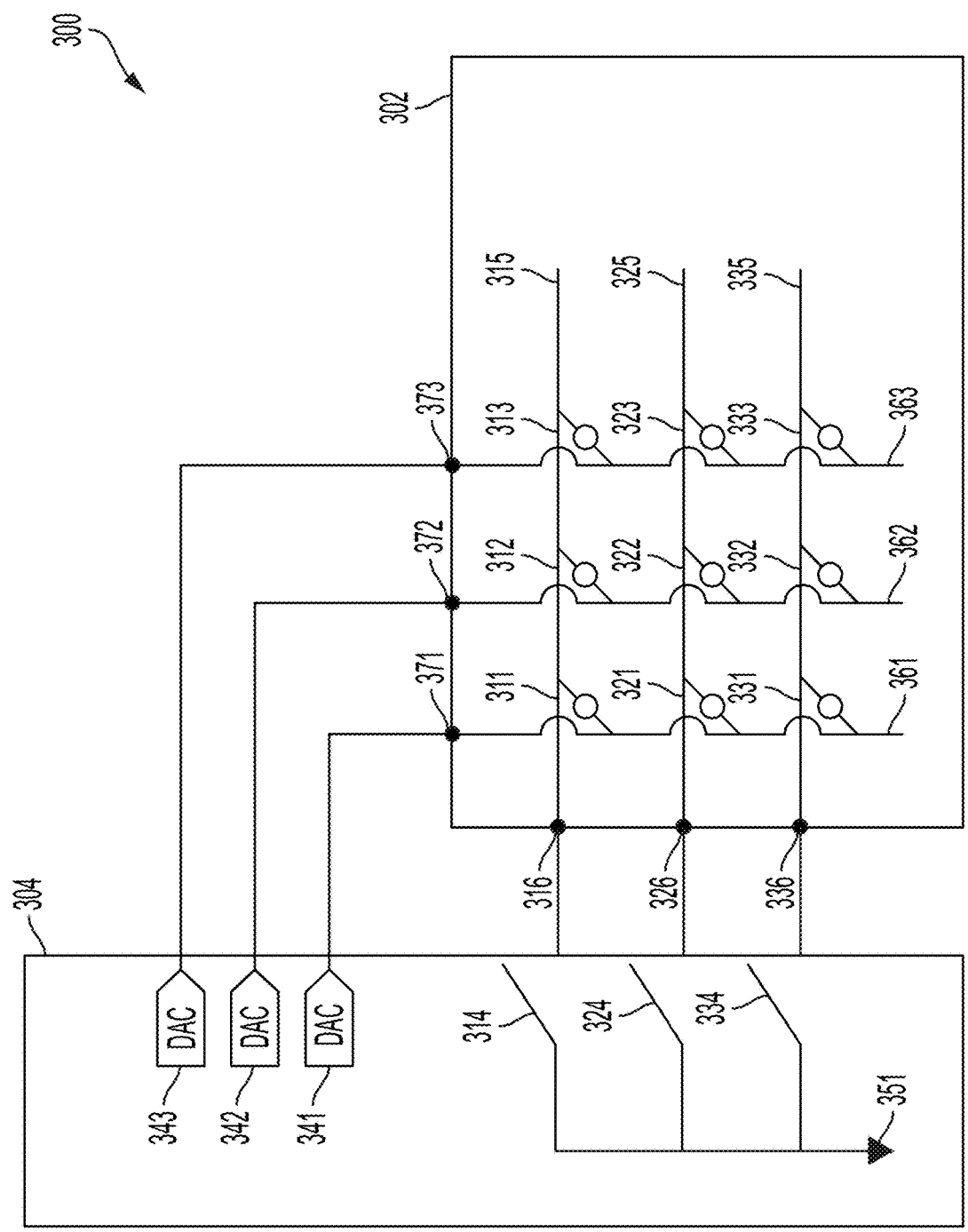
FIG. 3A is a schematic diagram of an integrated circuit for controlling a photonic device, in accordance with some non-limiting embodiments.

The embodiment illustrated in FIG. 3A significantly reduces the number of pins required to control the electrically-controllable photonic components. FIG. 3A illustrates a photonic processing system 300, in accordance with some embodiments. Photonic processing system 300 includes photonic processor 302 and electronic controller 304. Photonic processor 302 and electronic controller 304 are formed on separate dies. Photonic processor 302 may be implemented in silicon photonics or using any other suitable semiconductor material. Photonic processor 302 includes electrical lines (e.g., conductive traces) disposed in columns and rows. In this example, photonic processor 302 includes row lines 315, 325 and 335, and column lines 361, 362 and 363. Of course, not all embodiments are limited to three column lines and three row lines. Other embodiments may include, for example, between 8 and 1024 row lines and between 8 and 1024 column lines. Other ranges are also possible. It should be appreciated that the row and column lines need not be disposed physically orthogonal to one another, that two row lines need not be disposed physically parallel to one another and that two column lines also need not be disposed physically parallel to one another. The denominations "row" and "column" are used solely for purposes of illustration.

The end of each column line is coupled to an input pin. Column line 361 is coupled to input pin 371, column line 362 is coupled to input pin 372 and column line 363 is coupled to input pin 373. Similarly, the end of each row line is coupled to an output pin. Row line 315 is coupled to output pin 316, row line 325 is coupled to output pin 326 and row line 335 is coupled to output pin 336. Similar to the pins of FIG. 1, the input and output pins of FIG. 3A are positioned at the interface between photonic processor 302 and the devices outside the photonic processor. As a result, the pins are accessible from any electronic apparatus located outside the photonic processor, such as electronic controller 304 in this case. The input and output pins may be disposed at the perimeter of the photonic processor chip or at the top and/or bottom surface of the photonic processor chip. The output and input pins may be implemented using the example pins described in connection with FIG. 1. In some embodiments, some or all the input pins are disposed at a common edge of the perimeter of the photonic processor chip. In some embodiments, some or all the output pins are disposed at a common edge (e.g., the same common edge as the input pins or another common edge) of the perimeter of the photonic processor chip.

Photonic processor 302 includes nine electrically-controllable photonic components. The electronic components of FIG. 3A may have characteristics similar to the photonic components of FIG. 1. Photonic component 311 is coupled to both column line 361 and row line 315. Photonic component 312 is coupled to both column line 362 and row line 315. Photonic component 313 is coupled to both column line 363 and row line 315. Photonic component 321 is coupled to both column line 361 and row line 325. Photonic component 322 is coupled to both column line 362 and row line 325. Photonic component 323 is coupled to both column line 363 and row line 325. Photonic component 331 is coupled to both column line 361 and row line 335. Photonic component 332 is coupled to both column line 362 and row line 335. Photonic component 333 is coupled to both column line 363 and row line 335. In some embodiments, photonic processor 302 may include between 64 and 550,000 photonic components, or more.

Although the number of photonic components of FIG. 3A is the same as the number of photonic components of FIG. 1, the number of pins of FIG. 3A is substantially lower than the number of pins of FIG. 1. In these examples, the architecture of FIG. 1 includes nine pins whereas the architecture of FIG. 3A includes six pins. More generally, the architecture of FIG. 3A includes X+Y pins, where X is the number of column lines and Y is the number of row lines. By contrast, the architecture of FIG. 1 includes X*Y pins. For large values of X and Y, the difference in pin counts can be quite significant.

In some embodiments the number of common input pins may be equal to the number of common output pins. In other embodiments the number of common input pins may be larger than the number of common output pins. In yet other embodiments, the number of common output pins may be larger than the number of common input pins.

Electronic controller 304 includes DACs 341, 342 and 343, switches 314, 324 and 334 and voltage reference terminal 351. It should be appreciated that the DACs are only one example of driver, and that other drivers may be used in addition to, or instead of, the DACs, including for example signal amplifiers, power amplifiers, modulator drivers and buffers. Each DAC is connected to an input pin. As a result, each DAC controls a corresponding set of photonic components. For example, DAC 341 controls photonic components 311, 321 and 331. Similarly, each switch is connected to an output pin. Each switch is coupled to a set of photonic components. For example, switch 314 is coupled to photonic components 311, 312 and 313.

The architecture of FIG. 3A, in addition to reducing the number of pins required to control the electrically-controllable photonic components, reduces the number of DACs (or other drivers) required to control the electrically-controllable photonic components. In some embodiments including n electrically-controllable photonic components, where n=X×Y, the number of drivers used to control n electrically-controllable photonic components is reduced from n to just X.

A switch is said to be "closed" when it permits passage of an electric current and is said to be "open" when it blocks the current (other than negligible currents such as leakage currents). When closed, a switch couples the respective common output pin to the reference voltage terminal 351. Therefore, when a switch is closed, a continuous conductive path that passes through a photonic component is formed from a DAC to the reference voltage terminal. For example, when switch 314 is closed, a continuous conductive path that passes through photonic component 311 is formed from DAC 341 to voltage reference terminal 351. As a result, closing the switch associated with a particular row line enables the DACs to control the photonic components of that row line. By contrast, opening the switch associated with a particular row line disables the DACs from controlling the photonic components of that row line.

In some embodiments, a switch may be a simple transistor such as a single bipolar junction transistors (BJT) or field effect transistors (FET). Additionally, or alternatively, a switch may include a plurality of transistors, including BJTs, FETs, or a combination of BJTs and FETs, as aspects of the technology described herein are not limited in this respect.

In some embodiments, the states of the switches may be controlled by an external processor, such as processor 211 of controller 207 in FIG. 2. In other embodiments, the states of the switches may be controlled by an additional external processor (not shown). In yet other embodiments, switches may be configured to automatically close and open based on a clock cycle associated with the system.

Figure 3B:
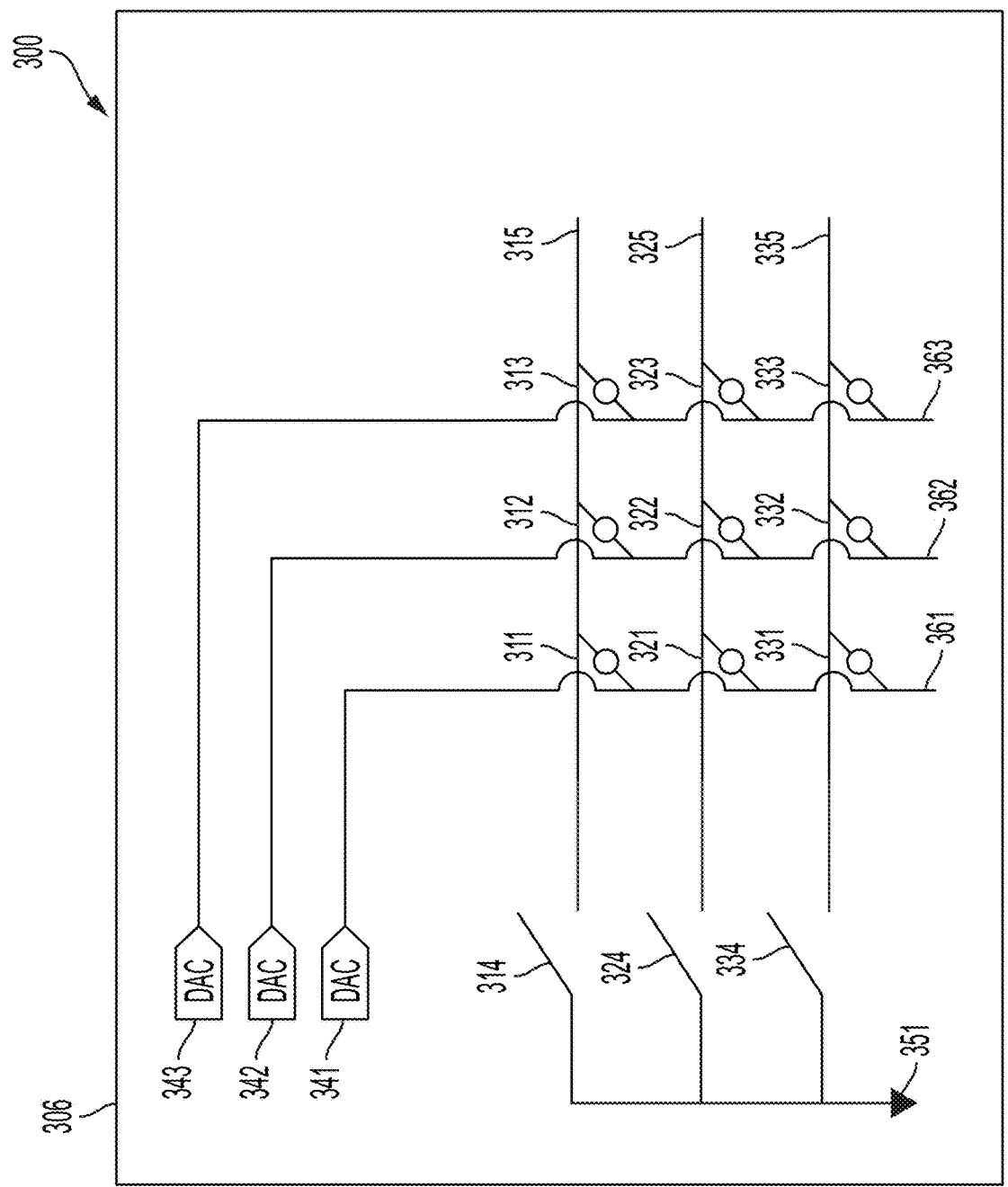
FIG. 3B is a schematic diagram of another integrated circuit for controlling a photonic device, in accordance with some non-limiting embodiments.

The illustrated embodiment of FIG. 3A separates electronic components that include transistors onto the electronic chip and photonic components onto the photonic chip. However, the inventors have recognized and appreciated that even if the electronic components and the photonic components are included on the same chip, an integrated circuit that reduces the number of electronic components may provide for a larger number of photonic components on the chip. FIG. 3B illustrates an embodiment where common conductive input traces and common conductive output traces are used to individually control the electrically-controllable photonic components of a common chip 306. The inventors have recognized and appreciated that shared signal traces may increase the number of electrically-controllable photonic components that can be controlled at once by reducing the number of traces or electronic components required to individually control the electrically-controllable photonic components.

Figure 3C:
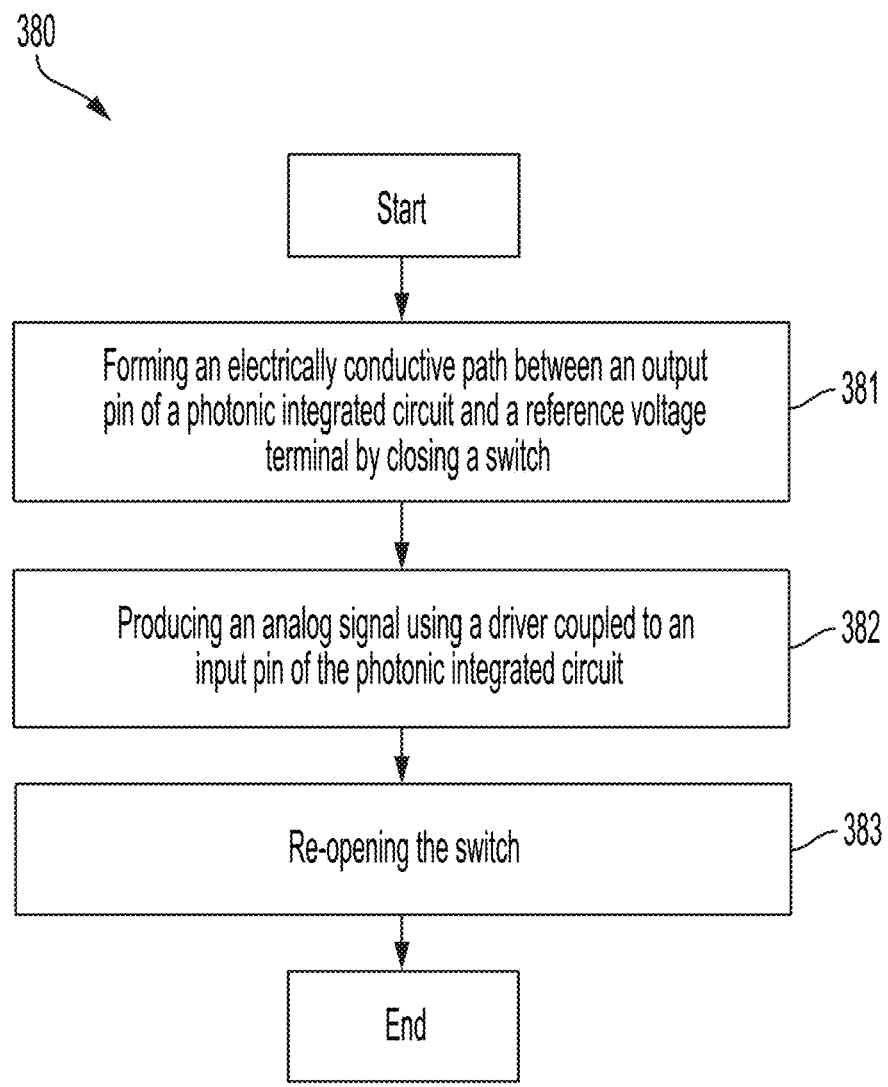
FIG. 3C is a flowchart of a method for operating a photonic processing system, in accordance with some non-limiting embodiments.

FIG. 3C is a flowchart illustrating a method for operating a photonic processing system including a photonic integrated circuit and an electronic integrated circuit, in accordance with some embodiments. Method 380 may be implemented using the architectures of FIG. 3A or 3B, or using any other suitable architecture.

Method 380 begins at act 381, where an electrically conductive path between an output pin of a photonic integrated circuit and a reference voltage terminal is formed by closing a switch. In some embodiments, the switch may close in response to receiving a signal from an external processor. For example, referring to the examples of FIGS. 2 and 3A, processor 211 of controller 207 may send signals for controlling the state of switch 314.

Additionally, or alternatively, the switch may close according to a timing circuit. For example, in the illustrated embodiment of FIG. 3A, a timing circuit (not shown) may cause switches to sequentially open and close. Switch 314 may close first according to a first signal received from a timing circuit and may open in response to a second signal received from the timing circuit. Next, switch 324 may open in response to a third signal arriving after the second signal. In other embodiments, the second signal, while causing the first switch to open 314, may additionally cause the second switch 324 to close.

Additionally, or alternatively, a first switch may close in response to the opening of a second switch. For example, in the illustrated embodiment of FIG. 3A, switch 324 may close in response to switch 314 opening.

Next, method 380 proceeds to act 382, where an analog signal is produced using a driver coupled to an input pin of the photonic integrated circuit. For example, in some embodiments, the driver includes a DAC that outputs a signal configured to modulate an optical signal passing through an electrically-controllable photonic component.

Next, method 380 proceeds to act 383, where the switch is re-opened. In some embodiments, the switch re-opening may be in response to another switch being closed. In other embodiments, the re-opening of the switch may happen automatically after a specified duration of the switch being closed.

In some embodiments, method 380 is characterized by a switch frequency where the switch frequency corresponds to the number of times an electrically-controllable photonic component receives a signal from a driver for a given time interval. The electrically-controllable photonic components may retain their state even when coupled to an open switch via thermal mass or local capacitance, in some embodiments. For example, the retention of the electrically-controllable photonic components may be characterized by a droop time constant. The droop time constant is indicative of a change in the effective dielectric constant associated with the electrically-controllable photonic component. For example, in some embodiments, the droop time constant may be indicative of the discharge rate of a capacitor. In other embodiments, the droop time constant may be indicative of the heat dissipation time.

In some embodiments, the switch frequency may be proportional to the inverse of the droop time constant of the electrically-controllable photonic component, such that the electrically-controllable photonic component receives one modulation signal within a time interval corresponding to the droop time constant. Additionally, or alternatively, the switch frequency may be larger than the inverse of the droop time constant, such that the electrically-controllable photonic component receives two or more modulation signals within a time interval corresponding to the droop time constant.

In some embodiments, some of the electrically-controllable photonic components receive at least one modulation signal within a time interval corresponding to the droop time constant. For example, all electrically-controllable photonic components may receive at least one modulation signal within a time interval corresponding to the droop time constant. Additionally, or alternatively, a subset of the total number of electrically-controllable photonic components may receive at least one modulation signal within a time interval corresponding to the droop time while other electrically-controllable photonic components may receive fewer than one modulation signal within a time interval corresponding to the droop time.

Additionally, or alternatively, a first set of photonic components may be characterized by a first droop time constant, while a second set of components may be characterized by a second droop time constant. In some embodiments the switch frequency may account for the differences between the droop time constants. For example, if the first droop time constant is shorter than the second time droop time constant, where a shorter droop time constant corresponds to a faster decay of a state of the electrically-controllable photonic component, the switch frequency corresponding to components characterized by the first droop time constant may be faster than the switch frequency associated with components characterized by the second droop time constant.

As another example, the switches may be operated non-sequentially. For example, in the illustrated embodiment of FIG. 3A, switch 314 may close and re-open first, followed by switch 334 closing and re-opening, followed again by switch 314 closing and re-opening, and finally followed by switch 324 closing and re-opening. In some embodiments, each switch may be closed and re-opened once before switches are closed a second time. In other embodiments, a single switch may close and re-open multiple times before a second switch is closed for a first time. In yet other embodiments, two switches may close at the same time so the same signal can be received by two components simultaneously.

III. Examples of Photonic Components

In some embodiments the photonic components described above include optical modulators. A modulator receives coherent light (e.g., laser pulses or laser continuous wave light) and modulates it according to an electrical modulating signal. As described above, the electrical modulating signal may be produced by a DAC. Some electrically-controllable photonic components include intensity modulators, some electrically-controllable photonic components include phase modulators, and some electrically-controllable photonic components include both intensity and phase modulators. Modulation of the intensity and/or phase may involve modulating the effective refractive index of the electrically-controllable photonic component.

In some embodiments, impedance components may modulate signal using a resistive, capacitive, or inductive component by modulating an effective refractive index of the photonic component. For example, in some embodiments, electrically-controllable photonic components may include electro-optical modulators, ring or disk modulators, or other types of resonant modulators, electro-absorption modulators, Franz-Keldysh modulators, Mach-Zehnder modulators, acousto-optical modulators, Stark-effect modulators, magneto-optical modulators, thermo-optical modulators, liquid crystal modulators, quantum-confinement optical modulators, and photonic crystal modulators, among other possible types of modulators, as aspects of the technology described herein are not limited in this respect.

Figure 4:
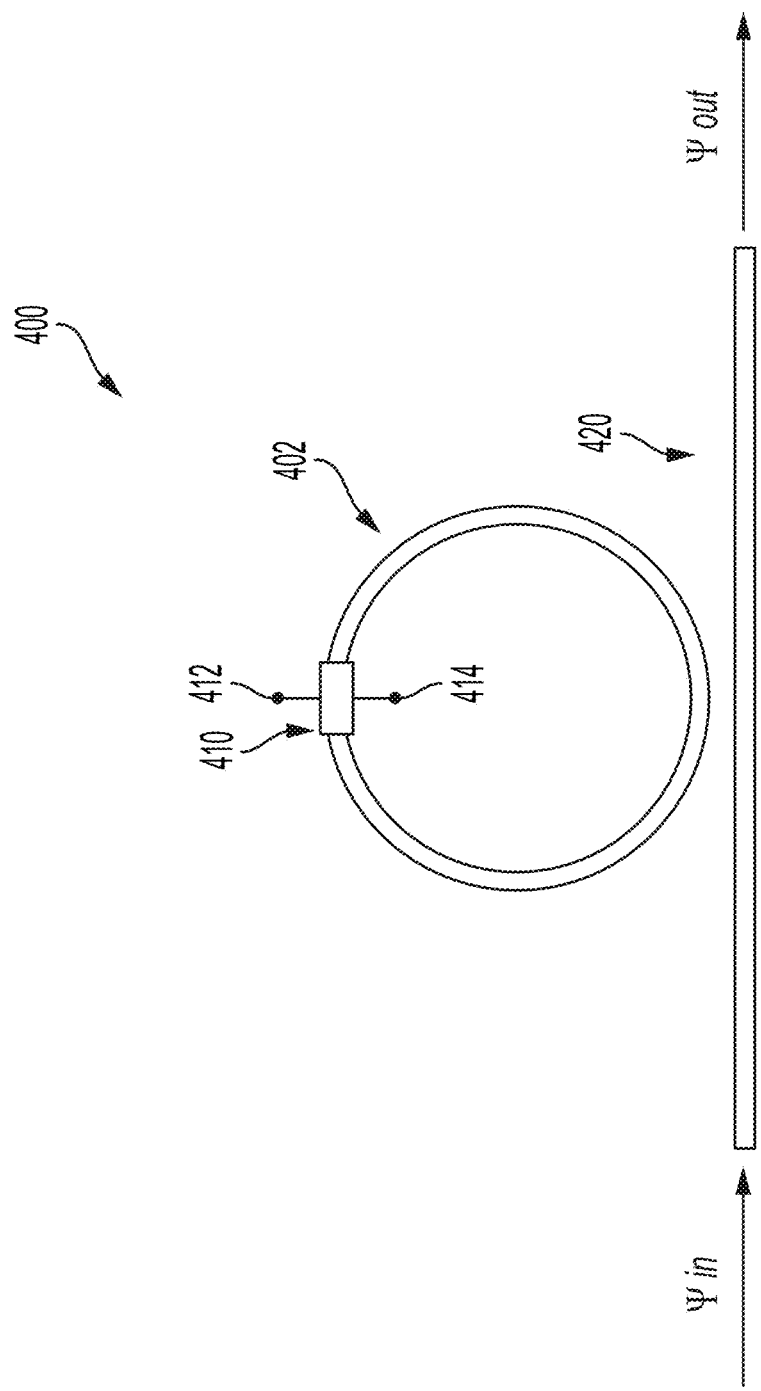
FIG. 4 is a schematic diagram of an electrically-controllable ring modulator for modulating optical signals, in accordance with some non-limiting embodiments.

Electrically-controllable photonic components may include ring modulators, in some embodiments. For example, FIG. 4 illustrates an electrically-controllable ring modulator 400. The ring modulator 400 includes an optical ring resonator 402 optically coupled to waveguide 420. Waveguide 420 receives input optical signals $\psi_{in}$ and outputs modulated optical signals $\psi_{out}$. Optical ring resonator 402 includes impedance component 410 (e.g., an optical phase shifter). Impedance component 410 includes electrical input 412 and electrical output 414. In some embodiments, electrical input 412 is coupled to an input pin of the photonic integrated circuit and electrical output 414 is coupled to an output pin of the photonic integrated circuit. Impedance component 410 is configured to modulate input optical signal $\psi_{in}$ response to receiving an electrical signal to produce a modulated output signal ψout.

Figure 5:
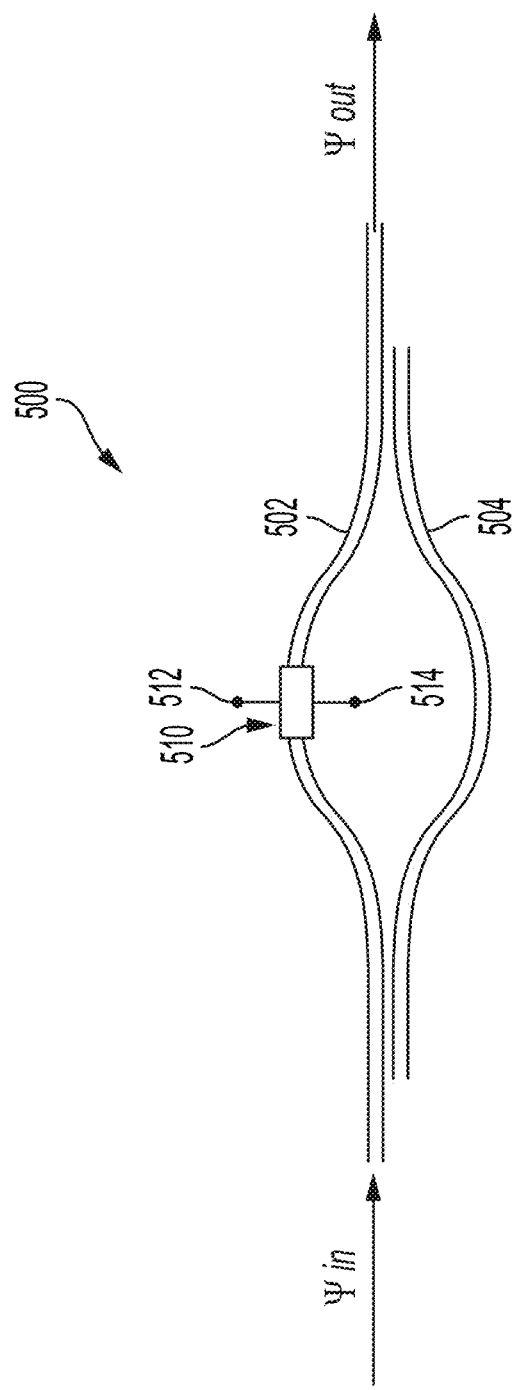
FIG. 5 is a schematic diagram of an electrically-controllable Mach-Zehnder interferometer for modulating optical signals, in accordance with some non-limiting embodiments.

Additionally, or alternatively, electrically-controllable photonic components include Mach-Zehnder interferometers (MZI), in some embodiments. For example, FIG. 5 illustrates an electrically controllable MZI modulator 500. The MZI modulator includes a first interferometer arm 502 and a second interferometer arm 504. The first interferometer arm receives an input optical signal $\psi_{in}$ and produces a modulated output signal $\psi_{out}$. In some embodiments, an impedance component 510 (e.g., an optical phase shifter) is coupled to the first arm 502 for modulating the optical signal that transmits through the first arm. Impedance component 510 includes electrical input 512 and electrical output 514. In some embodiments, electrical input 512 is coupled to an input pin of the photonic integrated circuit and electrical output 514 is coupled to an output pin of the photonic integrated circuit.

Figure 6:
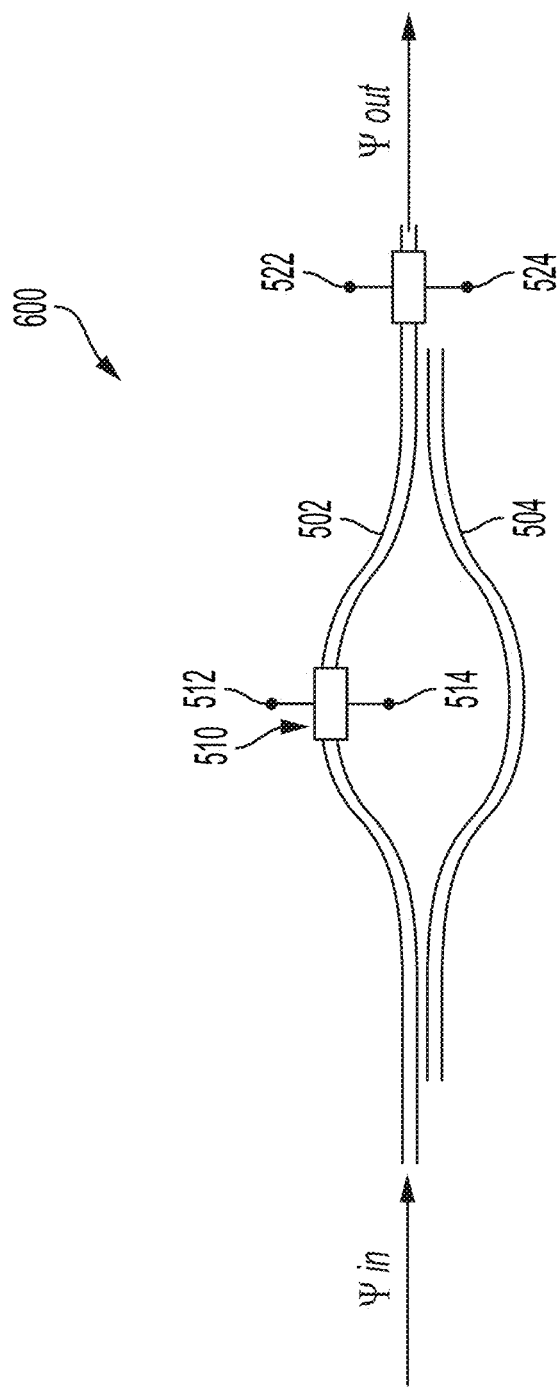
FIG. 6 is a schematic diagram of another electrically controllable Mach-Zehnder interferometer for modulating optical signals, in accordance with some non-limiting embodiments.

In other embodiments, electrically-controllable photonic components may include a plurality of impedance components. For example, FIG. 6 illustrates an electrically controllable MZI 600, which is similar to the MZI of FIG. 5. Relative to the MZI of FIG. 5, the MZI of FIG. 6 further includes second impedance component 520, which may be configured to modulate the phase of $\psi_{out}$. In some embodiments, electrical input 522 is coupled to an input pin of the photonic integrated circuit and electrical output 524 is coupled to an output pin of the photonic integrated circuit.

IV. Examples of Packages

As described above, some semiconductor foundries do not permit co-integration of transistors and photonic components on the same chip. As a result, the drivers and switches may be located on an electronic chip as components of an electronic integrated circuit, and the photonic components may be located on a photonic chip as components of a photonic integrated circuit. The photonic integrated circuit is electrically coupled to the electronic integrated circuit through external interconnects. As described below, input and output pins are configured to interface the external interconnects to the photonic components inside the photonic processor chip.

Figure 7:
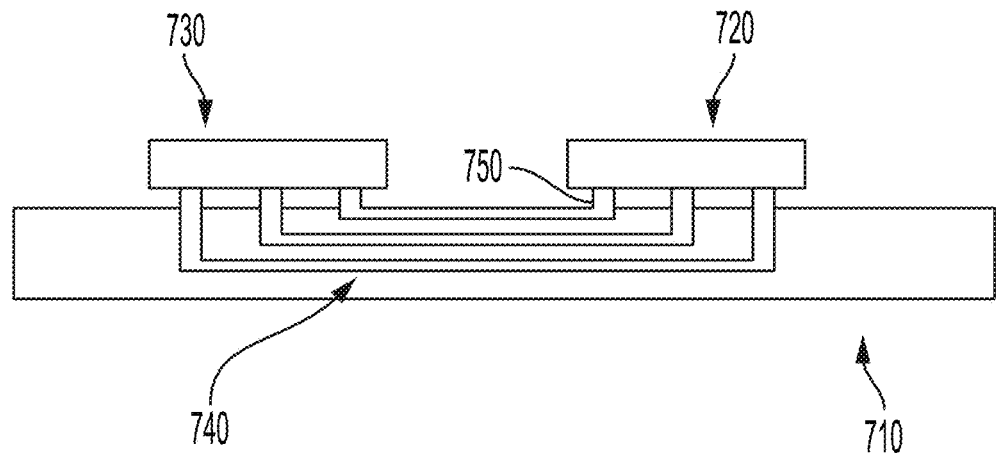
FIG. 7 is a cross sectional side view of a photonic package, in accordance with some non-limiting embodiments.

In some embodiments, the electrical coupling between the photonic integrated circuit and the electronic integrated circuit includes an interposer (e.g., a silicon interposer or an organic interposer). For example, in the illustrated embodiment of FIG. 7, the photonic integrated circuit 720 is coupled to the electronic integrated circuit 730 through interposer 710. Photonic integrated circuit 720 may include, for example, the photonic processor of FIG. 3A. Similarly, electronic integrated circuit 730 may include, for example, the electronic controller of FIG. 3A.

Interposer 710 provides electrical connections between the photonic integrated circuit 720 and electronic integrated circuit 730 through conductive traces 740. In some embodiments, the photonic integrated circuit electrically connects to the interposer through pins such as copper pillars 750. In other embodiments, the interposer may electrically connect to the top surface of the photonic integrated circuit through pins such as conductive pads disposed at or near a top surface of the photonic integrated circuit. In yet other embodiments, the photonic integrated circuit may be electrically connected to the interposer using other packaging techniques or a combination of packaging techniques, as the technology described herein is not limited in this respect.

Figure 8A:
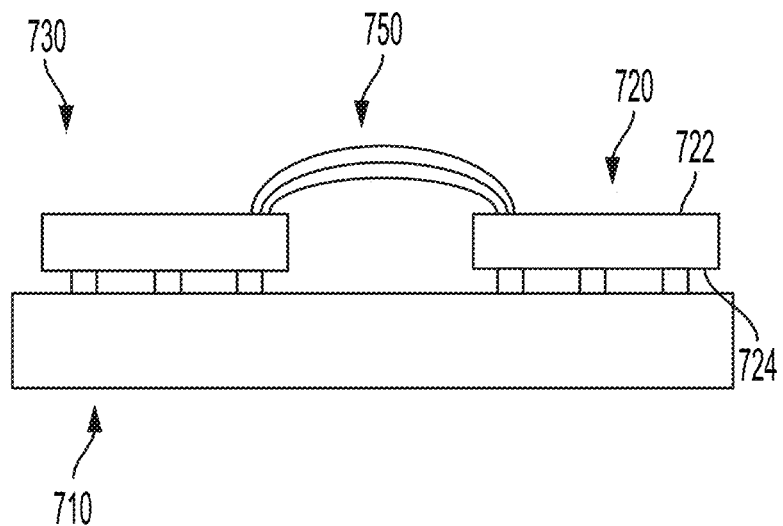
FIG. 8A is a cross sectional side view of another photonic package, in accordance with some non-limiting embodiments.
Figure 8B:
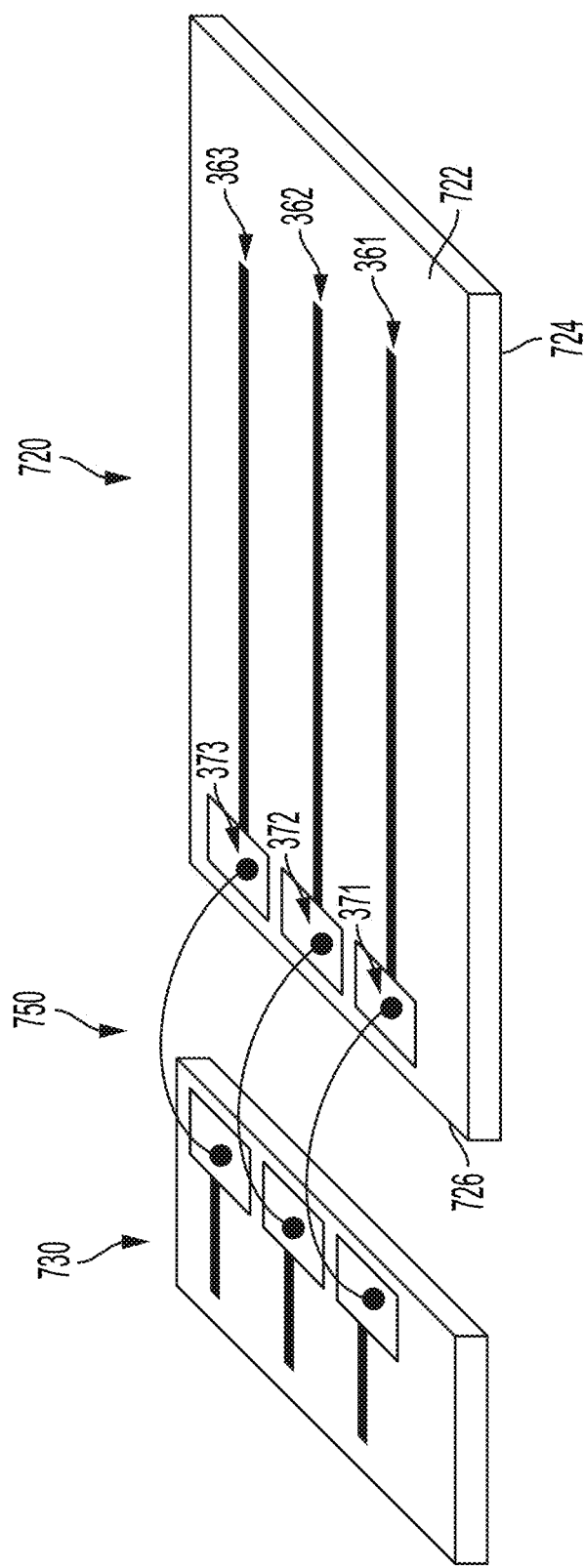
FIG. 8B is a perspective view of the photonic package of FIG. 8A, in accordance with some non-limiting embodiments.

In some embodiments, the coupling between the photonic integrated circuit and the electronic integrated circuit includes wire bonds and conductive pads. For example, in the illustrated embodiment of FIG. 8A, the photonic integrated circuit is electrically coupled to the electronic integrated circuit through wire bonds 750. As further illustrated in FIG. 8B, wire bonds 750 electrically couple electronic integrated circuit 730 to photonic integrated circuit 720. The wire bonds 750 bond to input pins 371, 372, and 373 where the input pins include conductive pads located at or near the top surface 722 of the photonic integrated circuit. The conductive pads couple input electrical signals received from wire bonds 750 into conductive traces 361, 362, and 363 respectively. In the illustrated embodiment, conductive pads 371, 372, and 373 are located along one side of the perimeter 726. The electrically-controllable photonic components (not shown) couple conductive traces 361, 362, and 363 to output pins (not shown).

In some embodiments, electrical coupling may include pins on both the top and bottom surfaces of the photonic integrated circuit. For example, input pins may include conductive pads on the top surface 722 of the photonic integrated circuit for receiving signals from electronic integrated circuit drivers through wire bonds 750. The output pins may include a pin grid array on the bottom surface 724 of the photonic integrated circuit for coupling to electronic integrated circuit switches through substrate 710. Additionally, or alternatively, both the top surface 722 and the bottom surface 724 may include both input pins and output pins and may utilize any form of packaging as described herein for coupling to electronic integrated circuit 730.

In some embodiments conductive pads may be located along multiple sides of the perimeter. In some embodiments, conductive pads corresponding to input pins are located on a different side of the perimeter than conductive pads corresponding to output pins. Additionally, or alternatively, conductive pads corresponding to input pins and conductive pads corresponding to output pins are located on the same sides of the perimeter. In other embodiments, some or all conductive pads may be located away from the perimeter, in more centralized portions of the photonic integrated circuit.

Figure 9:
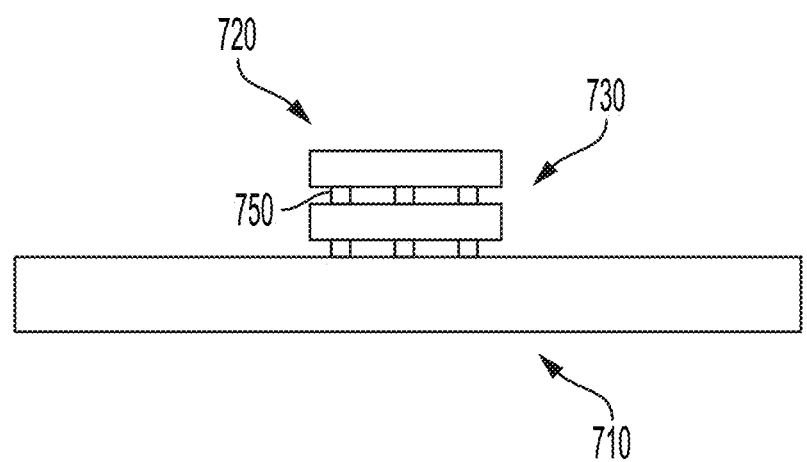
FIG. 9 is a cross sectional side view of yet another photonic package, in accordance with some non-limiting embodiments.

In some embodiments, the photonic integrated circuit and the electronic integrated circuit may be vertically stacked. For example, in the illustrated embodiment of FIG. 9, the photonic integrated circuit 720 is disposed on top of the electronic circuit 730. Pins 750 of photonic integrated circuit 720 may electrically couple to vias on the electronic integrated circuit 730. In some embodiments, vias may include through silicon vias. In other embodiments, vias may include through oxide vias. In yet other embodiments, blind vias and/or other packaging techniques may be used.

In other embodiments, the electronic integrated circuit may be disposed above or below of the photonic circuit. For example, the electronic integrated circuit drivers may be electrically coupled to input pins on the top surface of the integrated photonic circuit, while switches may couple to output pins on the bottom surface of the integrated photonic circuit. In some embodiments, the input pins on the top surface are conductive pads and the output pins on the bottom surface are a ball grid array. In other embodiments, the input pins and the output pins may each include any of the packaging techniques described herein.

Figure 10:
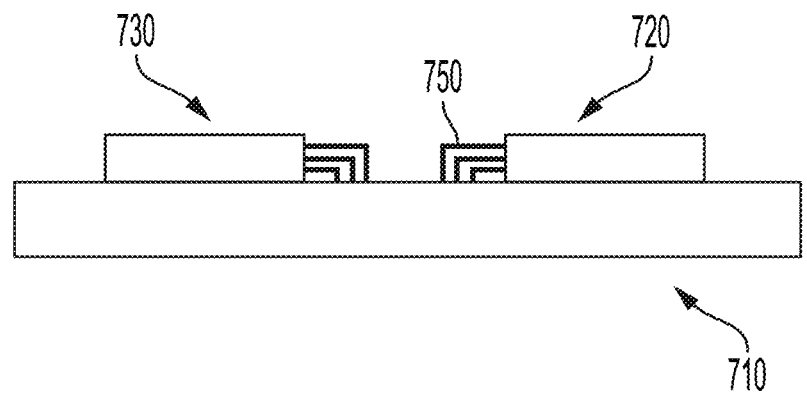
FIG. 10 is a cross sectional side view of yet another photonic package, in accordance with some non-limiting embodiments.

In some embodiments, the photonic integrated circuit includes pins extending from the side of the integrated circuit for receiving electrical signals. For example, in the illustrated embodiment of FIG. 10, photonic integrated circuit 720 includes input pins 750, extending from the side of the integrated circuit, coupled to substrate 710. The input pins may be coupled to substrate 710 through conductive pads or other packaging techniques as described herein.

In some embodiments, photonic integrated circuit input pins and output pins may extend from the same side of the photonic integrated circuit. Additionally, or alternatively, output pins may extend from a different side of a photonic integrated circuit.

In some embodiments, each input pin may have the same number of electrically-controllable photonic components coupled to it. In other embodiments, a first input pin may be coupled to a different number of electrically-controllable photonic components than a second input pin. In some embodiments, some output pins may not be coupled, through electrically-controllable photonic components, to every input pin.

Embodiments of the photonic processing system may be manufactured using conventional semiconductor manufacturing techniques. For example, waveguides and phase shifters may be formed in a substrate using conventional deposition, masking, etching, and doping techniques.

V. Conclusion

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The invention claimed is:

1. A photonic processing system, comprising:
   a photonic integrated circuit comprising:
      a first electrically-controllable photonic component electrically coupling an input pin to a first output pin; and
      a second electrically-controllable photonic component electrically coupling the input pin to a second output pin, and
   an electronic integrated circuit comprising:
      a driver electrically coupled to the input pin;
      a first switch electrically coupled to the first output pin; and
      a second switch electrically coupled to the second output pin.

2. The photonic processing system of claim 1, wherein the driver comprises a digital-to-analog converter (DAC).

3. The photonic processing system of claim 1, wherein the first switch and the second switch are electrically coupled to a common reference voltage terminal.

4. The photonic processing system of claim 3, wherein the reference voltage terminal is further coupled to the driver.

5. The photonic processing system of claim 1, wherein the electronic integrated circuit and the photonic integrated circuit are vertically stacked.

6. The photonic processing system of claim 1, wherein the electronic integrated circuit and the photonic integrated circuit are disposed on a common substrate.

7. The photonic processing system of claim 1, wherein the electronic integrated circuit and the photonic integrated circuit are disposed on an interposer.

8. The photonic processing system of claim 1, wherein the input pin is a first input pin and wherein the photonic integrated circuit further comprises a plurality of input pins and a plurality of output pins, wherein the plurality of output pins comprises the first output pin and the second output pin and the plurality of input pins comprises the first input pin.

9. The photonic processing system of claim 8, wherein the photonic integrated circuit further comprises a third electrically-controllable photonic component electrically coupling a second input pin of the plurality of input pins to the first output pin.

10. The photonic processing system of claim 9, wherein the photonic integrated circuit further comprises a fourth electrically-controllable photonic component electrically coupling the second input pin to the second output pin.

11. The photonic processing system of claim 8, wherein the plurality of input pins comprises between 8 and 1024 input pins, and wherein the plurality of output pins comprises between 8 and 1024 output pins.

12. The photonic processing system of claim 8, wherein the photonic integrated circuit comprises between 64 and 140,000 photonic components.

13. The photonic processing system of claim 1, wherein the first electrically-controllable photonic component comprises an optical modulator.

14. The photonic processing system of claim 13, wherein the optical modulator comprises a Mach-Zehnder interferometer.

15. The photonic processing system of claim 13, wherein the optical modulator comprises a ring modulator.

16. A photonic processing system, comprising:
    a photonic integrated circuit comprising:
       a first input pin and a first output pin; and
       a first electrically-controllable photonic component electrically coupling the first input pin to the first output pin; and
    an electronic integrated circuit comprising:
       a first driver electrically coupled to the first input pin; and
       a first switch electrically coupled to the first output pin.

17. The photonic processing system of claim 16, wherein the photonic integrated circuit further comprises a second output pin and a second electrically-controllable photonic component electrically coupling the first input pin to the second output pin, and wherein the electronic integrated circuit further comprises a second switch electrically coupled to the second output pin.

18. The photonic processing system of claim 17, wherein the photonic integrated circuit further comprises a second input pin and a third electrically-controllable photonic component electrically coupling the second input pin to the first output pin, and wherein the electronic integrated circuit further comprises a second driver electrically coupled to the second input pin.

19. The photonic processing system of claim 18, wherein the photonic integrated circuit further comprises a fourth electrically-controllable photonic component electrically coupling the second input pin to the second output pin.

20. The photonic processing system of claim 16, wherein the first driver comprises a digital-to-analog converter (DAC).

21. The photonic processing system of claim 16, wherein the photonic integrated circuit comprises a silicon photonics integrated circuit.

22. The photonic processing system of claim 16, wherein the photonic integrated circuit comprises between 8 and 1024 input pins, and between 8 and 1024 output pins.

23. The photonic processing system of claim 16, wherein the photonic integrated circuit comprises between 64 and 140,000 photonic components.

24. The photonic processing system of claim 16, wherein the first electrically-controllable photonic component comprises an optical modulator.

25. The photonic processing system of claim 16, wherein the electronic integrated circuit and the photonic integrated circuit are vertically stacked.

26. The photonic processing system of claim 16, wherein the electronic integrated circuit and the photonic integrated circuit are disposed on a common substrate.

27. The photonic processing system of claim 16, wherein the electronic integrated circuit and the photonic integrated circuit are disposed on an interposer.

* * * * *